(12) United States Patent
Kleverman et al.

(10) Patent No.: US 8,711,114 B2
(45) Date of Patent: Apr. 29, 2014

(54) TOUCH-SENSITIVE DEVICE AND COMMUNICATION DEVICE

(75) Inventors: Mats Kleverman, Helsingborg (SE); Jonas Moran, Torna-Hallestad (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 199 days.

(21) Appl. No.: 13/201,393

(22) PCT Filed: Sep. 13, 2010

(86) PCT No.: PCT/EP2010/063361
§ 371 (c)(1),
(2), (4) Date: Aug. 12, 2011

(87) PCT Pub. No.: WO2012/034577
PCT Pub. Date: Mar. 22, 2012

(65) Prior Publication Data
US 2012/0262383 A1  Oct. 18, 2012

(51) Int. Cl.
*G06F 3/041*  (2006.01)
(52) U.S. Cl.
USPC .......................... 345/173; 178/18.01
(58) Field of Classification Search
USPC ................. 345/173–184; 178/18.01
See application file for complete search history.

(56) References Cited

U.S. PATENT DOCUMENTS

| 6,707,027 | B2 * | 3/2004 | Liess et al. | 250/221 |
| 7,280,167 | B2 * | 10/2007 | Choi et al. | 349/12 |
| 7,924,272 | B2 * | 4/2011 | Boer et al. | 345/175 |
| 8,102,378 | B2 * | 1/2012 | Chung et al. | 345/173 |
| 8,350,827 | B2 * | 1/2013 | Chung et al. | 345/175 |
| 2008/0074401 | A1 * | 3/2008 | Chung et al. | 345/175 |
| 2008/0246905 | A1 * | 10/2008 | Chen et al. | 349/106 |
| 2009/0096767 | A1 * | 4/2009 | Liu et al. | 345/175 |

FOREIGN PATENT DOCUMENTS

| WO | 2005/026938 | 3/2005 |
| WO | 2005/125011 | 12/2005 |
| WO | 2008/111079 | 9/2008 |
| WO | 2009/027773 | 3/2009 |

OTHER PUBLICATIONS

International Search Report and Written Opinion dated Apr. 18, 2011, issued in corresponding PCT application No. PCT/EP2010/063361, 10 pages.

* cited by examiner

*Primary Examiner* — Abbas Abdulselam
(74) *Attorney, Agent, or Firm* — Snyder, Clark, Lesch & Chung, LLP

(57) ABSTRACT

Touch-sensitive device (10) that comprises a substrate (12) comprising a first set of holes extending in a first direction (14) through said substrate (12) whereby each hole forms an opening at a first side (12*a*) of said substrate (12) and a second set of holes extending in a second direction (16) through said substrate (12) whereby each hole forms an opening at said first side (12*a*) of said substrate (12), where said second direction (16) intersects said first direction (14). A transmitter (18) arranged to transmit electromagnetic radiation through said first set of holes, and a receiver (20) is arranged to receive electromagnetic radiation transmitted through said second set of holes, whereby the touch-sensitive device (10) is arranged to detect the presence and/or position of an object (22) on or above said first side (12*a*) of said substrate (12).

12 Claims, 2 Drawing Sheets

TOUCH-SENSITIVE DEVICE AND COMMUNICATION DEVICE

TECHNICAL FIELD

The present invention concerns a touch-sensitive-device and a communication device comprising at least one such touch-sensitive device.

BACKGROUND OF THE INVENTION

A touch-sensitive screen, or "touch screen", is an electronic visual display that can detect the presence and location of a touch within the display area. The term generally refers to touching the display of the device with a finger, a hand or another passive object, such as a stylus. The touch screen enables a user to interact directly with what is displayed, rather than indirectly with a cursor controlled by a mouse or touchpad.

There are a variety of touch screen technologies. The two most popular technologies are resistive and capacitive touch screens. A resistive touch screen panel is composed of several layers of which two are thin, metallic, electrically conductive layers which are separated by a narrow gap. When an object, such as a finger, presses down on a point on the panel's outer surface the two metallic layers become connected at that point: the panel then behaves as a pair of voltage dividers with connected outputs. This causes a change in the electrical current, which is registered as a touch event and sent to a controller for processing.

A capacitive touch screen panel consists of an insulator such as glass, coated with a transparent conductor such as indium tin oxide. As the human body is also a conductor, touching the surface of the screen with a finger for example results in a distortion of the screen's electrostatic field, measurable as a change in capacitance. Different technologies may be used to determine the location of the touch. The location is then sent to a controller for processing.

There are typically four layers in a resistive or capacitive touch screen; a top polyester layer coated with a transparent metallic conductive coating on the bottom, an adhesive spacer, a glass layer coated with a transparent metallic conductive coating on the top and an adhesive layer on the backside of the glass for mounting. The touch screen is normally illuminated using a backlight.

SUMMARY OF THE INVENTION

An object of the invention is to provide an improved touch-sensitive device.

This object is achieved by a touch-sensitive device that comprises a substrate comprising a first set of holes extending in a first direction through the substrate whereby each hole forms an opening at a first side of the substrate. The substrate also comprises a second set of holes extending in a second direction through the substrate whereby each hole forms an opening at the first side of the substrate, where the second direction intersects the first direction either at the first side of the substrate or at a distance above the first side of the substrate, i.e. the first and second sets of holes extend through the substrate at angles so that they converge at a point at, or above the first side of the substrate. The touch-sensitive device comprises a transmitter that is arranged to transmit electromagnetic radiation through the first set of holes, and a receiver that is arranged to receive electromagnetic radiation transmitted through the second set of holes. The receiver may for example be arranged to poll incoming reflected electromagnetic radiation continuously or periodically, whereby the touch-sensitive device is arranged to detect the presence and/or position of an object, such as a finger, hand or stylus, on or above the first side of the substrate by detecting electromagnetic radiation reflected from the object as it approaches the first side of the substrate and/or when it is touching the first side of the substrate. Once the presence and/or position of the object has been detected, a command that this represents may be communicated to an appropriate part of a communication device containing the touch-sensitive device or in wired or wireless communication therewith.

Such a substrate is easy to manufacture and it may be constituted of a material, such a metal, which was not possible to utilize with conventional touch-sensitive technologies.

The expression "set of holes" as used herein is intended to mean one or more holes. A touch-screen device according to the present invention may namely be used to detect the presence of an object at one specific location on the first side of the substrate. Preferably, each set of holes comprises a plurality of holes, According to an embodiment of the invention the second direction is arranged to intersect the first direction at a distance of 0 mm, 0-1 mm, 1-2 mm, 2-5 mm or 5-20 mm above the first side of the substrate.

According to another embodiment of the invention the substrate comprises a third set of holes extending in a third direction through the substrate whereby each hole forms an opening at the first side of the substrate, and a light source is arranged to transmit light through the third set of holes. The third direction may be arranged to intersect the first direction and the second direction.

According to an embodiment of the invention the transmitter and the receiver are arranged to respectively transmit/receive at least one of the following: infrared (IR), near infrared, visible, or ultraviolet radiation.

According to another embodiment of the invention the first set of holes, the second net of holes and/or the third set of holes are at least partly filled with transparent material, i.e. material that is transparent or at least partly transparent to the radiation transmitted by the transmitter and received by the receiver.

According to a further embodiment of the invention the substrate comprises non-transparent material, i.e. material that is not transparent to the radiation transmitted by the transmitter and received by the receiver or electrically conducting material, such as metal.

According to an embodiment of the invention the first set of holes, the second set of holes and/or the third set of holes have a maximum transverse dimension of 1-100 μm. The substrate may namely be perforated with micro-holes.

According to another embodiment of the invention at least one of the openings of the first, second and/or third set of holes is arranged to have a shape, size, colour and/or texture that is different to at least one other hole opening of the first, second and or third set of holes. One or more openings on the first side of the substrate may namely form an icon to facilitate selection by a user.

According to a further embodiment of the invention the openings of the first set of holes and the second set of holes cover only part of the first side of the substrate.

The present invention also concerns a portable or non-portable communication device that comprises an integral or non-integral touch-sensitive device according to any of the embodiments of the invention. The communication device constitutes a mobile telephone, media player, Personal Communications System (PCS) terminal, Personal Data Assistant (PDA), laptop computer, palmtop receiver, camera, television, radar or any appliance that includes a transducer designed to transmit and/or receive radio, television, telephone and/or radar signals.

BRIEF DESCRIPTION OF THE DRAWINGS

The present invention will hereinafter be further explained by means of non-limiting examples with reference to the appended figures where.

It should be noted that the drawings have not necessarily been drawn to scale and that the dimensions of certain features may have been exaggerated for the sake of clarity.

DETAILED DESCRIPTION OF EMBODIMENTS

Figure 1:
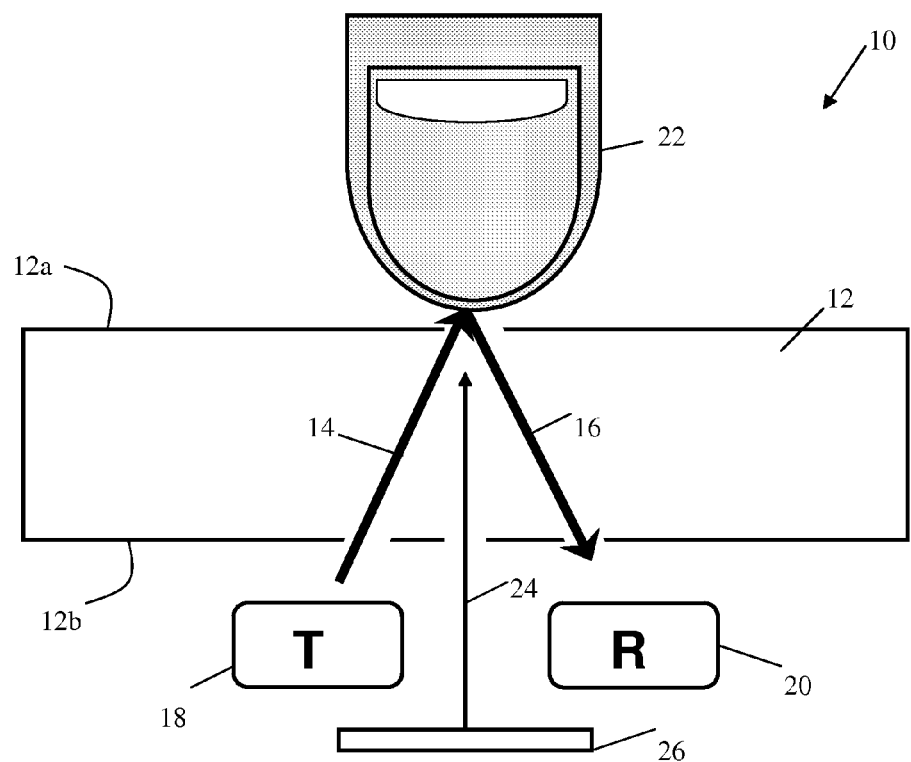
FIG. 1 shows a cross section of a touch-sensitive device according to an embodiment of the invention.

FIG. 1 shows a cross section of a touch-sensitive device 10 according to an embodiment of the invention. The touch-sensitive device comprises a substrate 12 having a first side 12a and a second side 12b opposite to the first side. The substrate 12 comprises first set of holes (only one of which is shown in FIG. 1) which extends in a first direction 14 through the substrate 12 from the second side 12b of the substrate 12 to the first side 12a of the substrate 12. Each hole forms an opening at the first side 12a of the substrate 12. The substrate 12 also comprises a second set of holes (only one of which is shown in FIG. 1) extending in a second direction 16 through the substrate 12 from the second side 12b of the substrate 12 to the first side 12a of the substrate 12, whereby each hole forms an opening at the first side 12a of the substrate 12. In the illustrated embodiment the second direction 16 intersects the first direction 14 at a distance above the first side 12a of the substrate 12, such as 0-1 mm, 1-2 mm, 2-5 mm or 5-20 mm above the first side 12a of the substrate 12.

A transmitter 18 is arranged to transmit electromagnetic radiation, such as infrared (IR), 1C) near infrared, visible, or ultraviolet radiation, through the first set of holes 14, and a receiver 20 is arranged to receive electromagnetic radiation transmitted through the second set of holes 16. The touch-sensitive device 10 is arranged to detect the presence and/or position of an object 22, such as a finger tip, on or above the first side 12a of the substrate 12 by detecting electromagnetic radiation reflected from the object 22. The touch-sensitive device 10 may be arranged to detect that an object 22 is approaching or is touching the first surface 12a of the substrate 12 or a specific part thereof when a pre-determined threshold of reflected electromagnetic radiation has been detected by the receiver 20.

The substrate 12 also comprises a third set of holes (only one of which is shown in FIG. 1) extending in a third direction 24 through the substrate 12 from the second side 12b of the substrate 12 to the first side 12a of the substrate 12 whereby each hole forms an opening at the first side 12a of the substrate 12. A light source 26 is arranged to transmit light through the third set of holes to illuminate one or more openings on the first side 12a of the substrate 12. In the illustrated embodiment the third direction 24 intersects the first direction 14 and the second direction 16 at a distance above the first side 12a of the substrate 12.

Figure 2:
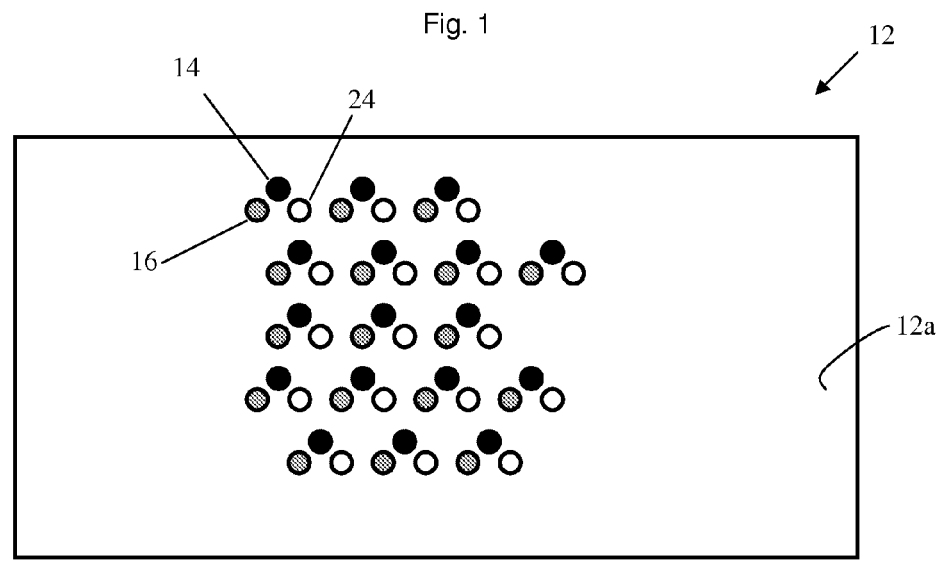
FIG. 2 shows the first side of a substrate of a touch-sensitive device according to an embodiment of the invention.

FIG. 2 shows the first side 12a of a substrate 12 of a touch-sensitive device 10 according to an embodiment of the invention from above. Part of the first side 12a of the substrate 12 is covered with openings formed by the first set of holes 14 (shaded black) which are arranged to transmit electromagnetic radiation from the transmitter 18 to the first side 12a of the substrate 12, and openings formed by the second set of holes 16 (shaded grey) which are arranged transmit electromagnetic radiation from the first side 12a of the substrate 12 to the receiver 20 and openings formed by the third set of holes 24 (no shading) which are arranged transmit light from the light source 26 to the first side 12a of the substrate 12. It should be noted that the openings at the first side 12a of the substrate 12 may be arranged in any suitable way as long as transmitted electromagnetic radiation from the transmitter 18 may be reflected by an object 22 and transmitted to the receiver 20 whereby the presence and/or position of an object 22 on the first side 12a of the substrate 12 may be detected.

Figure 3:
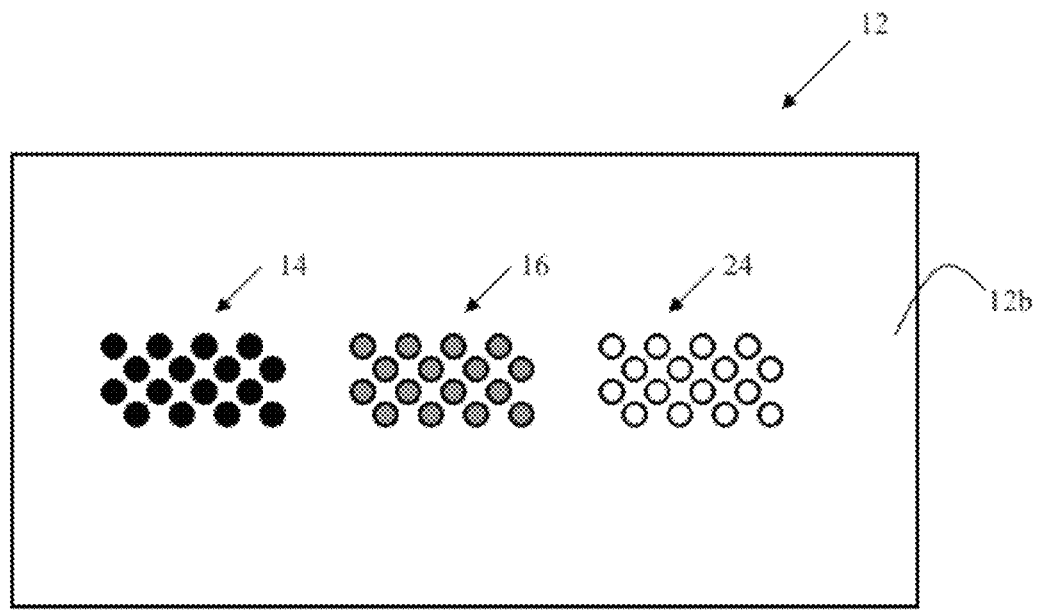
FIG. 3 shows the second side of a substrate of a touch-sensitive device according to an embodiment of the invention.

FIG. 3 shows the second side 12b of the substrate 12. In the illustrated embodiment the first set of holes 14 are grouped together so that they can be positioned adjacent to a transmitter 18, such as an IR light emitting diode (LED), the second set of holes 16 are grouped together so that they can be positioned adjacent to a receiver 18, such as an IR-sensitive sensor, and the third set of holes 24 are grouped together so that they can be positioned adjacent to a light source 26. It should be noted that the transmitter 18, the receiver 20 and the light source 26 need not necessarily be arranged on the same side of the substrate 12 as shown in the illustrated embodiment. A plurality of transmitters 18, receivers 20 and/or light sources 24 may also be used whereby all of the holes need not necessarily be grouped in a single part of the second side 12b of the substrate 12.

According to an embodiment of the invention the first set of holes 14, the second set of holes 16 and/or the third set of holes 24 is/are at least partly filled with transparent material. The holes may have a maximum transverse dimension of 1-100 μm. All of the holes within a set of holes or in different sets of holes need not necessarily be of the same size and shape.

The substrate 12 may be of any shape or size and may comprise any suitable material, i.e. any material that may be perforated with holes. The substrate 12 need not necessarily constitute a single flat panel as shown in the illustrated embodiments. The substrate 12 may comprise a single layer of perforated material or it may comprise a plurality of layers, one or more of which may be perforated with holes.

Figure 4:
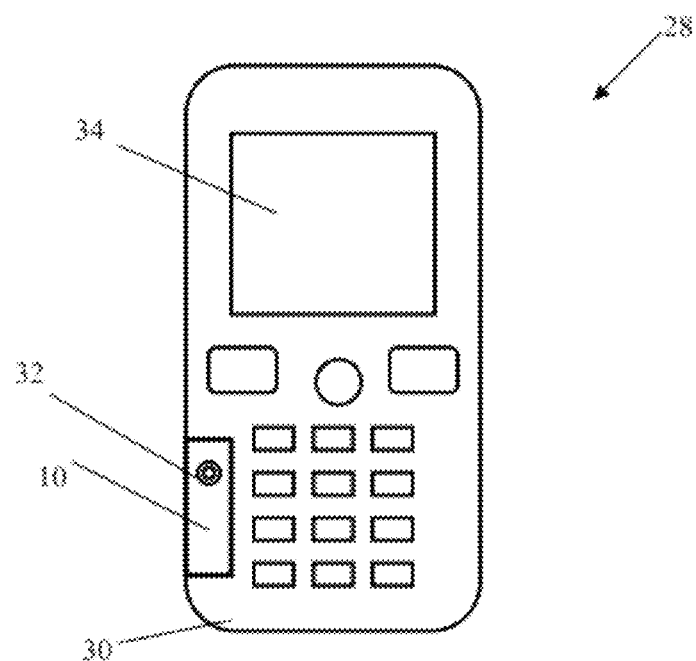
FIG. 4 shows a communication device according to an embodiment of the invention.

FIG. 4 shows a communication device 28, namely a mobile telephone according to an embodiment of the invention. The communication device 28 comprises a touch-sensitive device 10 according to the present invention which is integrated into the housing 30 of the communication device 28. The touch-sensitive device 10 may comprise a backlit icon 32 formed by one or more openings in the first side 12a of the substrate 12 of the touch-sensitive device 10. Detection of an object 22 on or near the icon 32 may for example be used to switch the communication device on and/or off, or to provide commands that may be communicated to other parts the communication device 28 or to other devices. Alternatively or additionally, the touch-sensitive device 10 according to the present invention may be integrated into another part of the communication device 28, such as its display means 34, and/or an external component/device in wireless or wired communication with the communication device 28, such as a headset.

Further modifications of the invention within the scope of the claims would be apparent to a skilled person. For example, numerous optic devices may be used to create, manipulate, (i.e. split, merge, re-direct, focus) or detect/measure electromagnetic radiation in a touch-sensitive device according to the present invention.

The invention claimed is:

1. A touch-sensitive device, comprising:
    a substrate comprising a first set of holes extending in a first direction through said substrate, wherein each hole forms an opening at a first side of said substrate,
    a second set of holes extending in a second direction through said substrate, wherein each hole forms an opening at said first side of said substrate, where said second direction intersects said first direction,
    a transmitter arranged to transmit electromagnetic radiation through said first set of holes, and
    a receiver arranged to receive electromagnetic radiation transmitted through said second set of holes, wherein the touch-sensitive device is arranged to detect the presence and/or position of an object on or above said first side of said substrate by detecting electromagnetic radiation reflected from said object.

2. The device of claim 1, wherein said second direction is arranged to intersect said first direction at a distance of 0 mm, 0-1 mm, 1-2 mm, 2-5 mm or 5-20 mm above said first side of the substrate.

3. The device according to claim 1 wherein said substrate comprises a third set of holes extending in a third direction through said substrate, wherein each hole forms an opening at said first side of said substrate, and a light source is arranged to transmit light through the third set of holes.

4. The device according to claim 3, wherein said third direction is arranged to intersect said first direction and said second direction.

5. The device of claim 1, wherein said transmitter and said receiver are arranged to respectively transmit/receive at least one of the following: infrared (IR), near infrared, visible, or ultraviolet radiation.

6. The device of claim 1, wherein said first set of holes, said second set of holes and/or said third set of holes are at least partly filled with transparent material.

7. The device of claim 1, wherein said substrate comprises non-transparent material or electrically conducting material.

8. The device of claim 1, wherein said first set of holes, said second set of holes and/or said third set of holes have a maximum transverse dimension of 1-100 µm.

9. The device of claim 3, wherein at least one of said openings of said first, second or third set of holes is arranged to have a shape, size, colour and/or texture that is different to at least one other opening of said first, second or third set of holes.

10. The device of claim 1, wherein said openings of said first set of holes and said second set of holes cover only part of said first side of said substrate.

11. A communication device, comprising a touch-sensitive device according to claim 1.

12. The communication device according to claim 11, wherein the communication device comprises a mobile telephone, media player, Personal Communications System (PCS) terminal, Personal Data Assistant (PDA), laptop computer, palmtop receiver, camera, television, radar or any appliance that includes a transducer designed to transmit and/or receive radio, television, telephone and/or radar signals.

* * * * *